United States Patent [19]
Ryou

[11] Patent Number: 5,464,787
[45] Date of Patent: Nov. 7, 1995

[54] SEMICONDUCTOR DEVICE AND A METHOD OF MANUFACTURING THE SAME

[75] Inventor: Eui K. Ryou, Seoul, Rep. of Korea

[73] Assignee: Hyundai Electronics Industries Co., Ltd., Kyungki-Do, Rep. of Korea

[21] Appl. No.: 366,770

[22] Filed: Dec. 30, 1994

[30] Foreign Application Priority Data

Dec. 30, 1993 [KR] Rep. of Korea .............. 93-31156

[51] Int. Cl.⁶ .............................................. H01L 21/8242
[52] U.S. Cl. .................... 437/52; 437/47; 437/60
[58] Field of Search ............................ 437/47, 48, 52, 437/60, 919; 257/306, 308

[56] References Cited

U.S. PATENT DOCUMENTS

| | | | |
|---|---|---|---|
| 5,294,561 | 3/1994 | Tamigawa | 437/60 |
| 5,314,845 | 5/1994 | Iguchi et al. | 437/52 |
| 5,389,560 | 2/1995 | Panle | 437/60 |
| 5,389,566 | 2/1995 | Lage | 437/60 |
| 5,389,568 | 2/1995 | Yum | 437/60 |

FOREIGN PATENT DOCUMENTS

| | | | |
|---|---|---|---|
| 3-133172 | 6/1991 | Japan | H01L 27/108 |
| 2-31458 | 10/1991 | Japan | 437/52 |

*Primary Examiner*—Tom Thomas
*Attorney, Agent, or Firm*—Fish & Richardson

[57] ABSTRACT

A semiconductor device and a method of manufacturing the same. In the present invention, the charge storage electrode has a structure in which trenches having a constant width and depth with a constant interval toward the center of the charge storage electrode along the side end of the charge storage electrode are formed, at least one other trench is formed on top of the charge storage electrode surrounding the other trench, and the bottom of the side of the charge storage electrode is shaped as a single step. Accordingly, the present invention can obtain the effect of increasing the efficient surface area of the charge storage electrode by forming at least one trench on the surface of the charge storage electrode, and the resulting increase in capacitance improves the reliability of the device.

22 Claims, 5 Drawing Sheets

5,464,787

SEMICONDUCTOR DEVICE AND A METHOD OF MANUFACTURING THE SAME

BACKGROUND OF THE INVENTION

1. Field of the Invention

The present invention relates to a semiconductor device and a method of manufacturing the same, and more particularly to a semiconductor device and a method of manufacturing the same which can increase the capacitance of a capacitor by forming one or more trenches on top of a charge storage electrode.

2. Description of the Prior Art

Conventionally, as a semiconductor integrated circuit becomes highly integrated, a unit cell area is decreased. However, a minimum capacitance is needed to operate the device despite the reduction of the unit cell area. Accordingly, research to ensure the minimum required capacitance in a limited area is being undertaken.

FIG. 1 is a sectional view of a capacitor manufactured by a prior art technology.

An active region and a field region are defined by forming a field oxide film 2 on a silicon substrate 1. A gate oxide film 3 and a gate electrode 4 are formed on predetermined portions of the active region and the field region, and an insulation spacer 5 is formed on the side of the gate electrode 4. A source electrode 6A and a drain electrode 6B are formed on the portions of the silicon substrate 1 exposed to both sides of the gate electrode 4 by an impurity ion implantation process. An interlayer insulation film 7 is thickly formed on the entire structure including the MOSFET. Therefore, the MOSFET having a LDD structure is formed. A silicon nitride film 8 and a first polysilicon layer 9 are sequentially deposited on the interlayer insulation film 7. The exposed portions of the first polysilicon layer 9 and the silicon nitride film 8 are sequentially etched by an anisotropic etching process utilizing a contact hole mask. The anisotropic etching process is performed so that the interlayer insulation film 7 which is a lower layer is sufficiently exposed. A polysilicon is deposited on the surface of the first polysilicon layer 9 including a recess which is formed by etching the first polysilicon layer 9 and the silicon nitride film 8. The polysilicon is etched by an anisotropic etching process so that a part of the interlayer insulation film 7 constituting the bottom of the recess is exposed, thereby polysilicon spacers 10 are formed on the inner wall of the recess. A contact hole is formed by etching the exposed interlayer insulation film 7 by an anisotropic etching process utilizing the first polysilicon layer 9 and the polysilicon spacers 10 as an etching mask until a part of the source electrode 6A is exposed. The width of the contact hole can be smaller than when using the contact hole mask because the contact hole is formed by a self-alignment etching process, so that the high integration of the semiconductor integrated circuit is facilitated. A second polysilicon layer 11 is deposited on the first polysilicon layer 9 and the polysilicon spacers 10 including the contact hole.

The second and first polysilicon layers 11 and 9 are etched by an anisotropic etching process utilizing a charge storage electrode mask, therefore a charge storage electrode of a capacitor composed of the polysilicon spacers 10, the first polysilicon layer 9 and the second polysilicon layer 11 is formed. The charge storage electrode is of the same shape and size as the charge storage electrode mask.

A dielectric film 17 is formed on the surface of the charge storage electrode. A third polysilicon layer 18 is deposited on an exposed part of the silicon nitride film 8 including the dielectric film 17. Thereafter, the third polysilicon layer 18 is etched by an anisotropic etching process utilizing a plate electrode mask, a plate electrode composed of the third polysilicon layer 18 is formed finally.

There are limits of the prior art capacitor formed by the above-described process to ensuring the required capacitance for the operation of the device as the semiconductor integrated circuit becomes highly integrated

SUMMARY OF THE INVENTION

Therefore, an object of the present invention is to increase the effective surface area of the charge storage electrode by forming one or more trenches on the surface of the charge storage electrode.

Another object of the present invention is to manufacture a highly integrated semiconductor device.

To achieve the objects of the present invention, a method for manufacturing a semiconductor device is as follows.

An interlayer insulation film is formed on a silicon substrate formed with a junction region. A silicon nitride film and a first polysilicon layer are sequentially deposited on the interlayer insulation film. Exposed portions of the first polysilicon layer and the silicon nitride film are sequentially etched by an etching process utilizing a contact hole mask, whereby a recess is formed. A polysilicon spacer is formed on the inner wall of the recess. The interlayer insulation film is etched by an etching process utilizing the first polysilicon layer and the polysilicon spacer as an etching mask until a part of the junction region is exposed, a contact hole is formed. A second polysilicon layer is deposited on the first silicon layer and the polysilicon spacer including the contact hole. A first oxide film and a third polysilicon layer are sequentially deposited on the second polysilicon layer. A photoresist pattern is formed on the third polysilicon layer by a photoresist patterning process utilizing a charge storage electrode mask. The exposed parts of the third polysilicon layer and the first oxide film are sequentially etched by an etching process utilizing the photoresist pattern as an etching mask, whereby the pattern composed of the third polysilicon layer and the first oxide film is formed. After removing the photoresist pattern, a second oxide film is deposited on the second polysilicon layer including the pattern. The polysilicon spacer is formed on the side wall of the pattern. The exposed part of the second oxide film is etched until a part of the surface of the second and third polysilicon layer is exposed. The exposed part of the second polysilicon layer is etched by an anisotropic polysilicon etching process, whereby the surface of the second polysilicon layer is stepped. The exposed part of the second oxide film is etched by an anisotropic oxide etching process to expose the second polysilicon layer between the pattern and the polysilicon spacer. An anisotropic polysilicon etching process utilizing the first and second oxide films remaining on the second polysilicon layer as an etching barrier layer is performed until the silicon nitride film is exposed, thereafter the remaining first and second oxide .films are removed to form a charge storage electrode. A dielectric film is formed on the surface of the charge storage electrode. A plate electrode is formed on the dielectric. In the structure of the charge storage electrode formed by this method, a trench having a constant width and depth with a constant interval toward the center of the charge storage electrode along the side end of the charge storage electrode is formed, and the bottom of the side of the charge storage electrode is shaped as a single step.

To achieve the objects of the present invention, an alternative method for manufacturing a semiconductor device is as follows.

An interlayer insulation film is formed on a silicon substrate formed with a junction region. A silicon nitride film and a first polysilicon layer are sequentially deposited on the interlayer insulation film. The exposed portions of the first polysilicon layer and silicon nitride film are sequentially etched by an etching process utilizing a contact hole mask, whereby a recess is formed. A polysilicon spacer is formed on the inner wall of the recess. The interlayer insulation film is etched by an etching process utilizing the first polysilicon layer and the polysilicon spacer as an etching mask until a part of the junction region is exposed, a contact hole is formed. A second polysilicon layer is deposited on the first polysilicon film and the polysilicon spacer including the contact hole. A first oxide film and a third polysilicon layer are sequentially deposited on the second polysilicon layer. A plurality of photoresist patterns are formed on the third polysilicon layer by a photoresist patterning process utilizing a charge storage electrode mask. The exposed parts of the third polysilicon layer and the first oxide film are sequentially etched through an etching process utilizing a plurality of photoresist patterns as an etching mask, whereby a plurality of patterns composed of the third polysilicon layer and the first oxide film is formed. After removing the plurality of photoresist patterns, a second oxide film is deposited on the second polysilicon layer including the plurality of patterns. A polysilicon is deposited and etched on said second oxide film to leave the polysilicon remained in a buried form between the patterns and to leave the polysilicon remained in the form of a spacer on the outer wall of the outer most pattern of the plurality of patterns. The exposed part of the second oxide film is etched through an etching process utilizing the remaining polysilicon as an etching mask until a part of the surface of the second and third polysilicon layers is exposed. The exposed part of the second polysilicon layer is etched by an anisotropic polysilicon etching process, whereby the surface of the second polysilicon layer is stepped. The exposed part of the second oxide film is etched by an anisotropic oxide etching process to expose the second polysilicon layer between the plurality of patterns and the remaining polysilicon. The anisotropic polysilicon etching process utilizing the first and second oxide films remaining on the second polysilicon layer as an etching barrier layer is performed until the silicon nitride film is exposed; thereafter, the remaining first and second oxide films are removed to form a charge storage electrode. A dielectric film is formed on the surface of the charge storage electrode. A plate electrode is formed on the dielectric. In the structure of the electric charge storing electrode formed by this method, a trench having a constant width and depth with a constant interval toward the center of the electric charge storing electrode along the side end of the charge storage electrode is formed; at least one other trench is formed on the top of the electric charge storing electrode surrounded by the trench; and the bottom of the side of the electric charge storing electrode is shaped as a single step.

BRIEF DESCRIPTION OF THE DRAWINGS

For a full understanding of the nature and objects of the present invention, reference should be made to the following detailed descriptions made in conjunction with the accompanying drawings in which.

DETAILED DESCRIPTION OF THE DRAWINGS

Given below is a detailed description of the present invention with reference to the accompanying drawings.

FIGS. 2A through 2D are sectional views illustrating the process of manufacturing the capacitor according to the first embodiment of the present invention.

Figure 1:
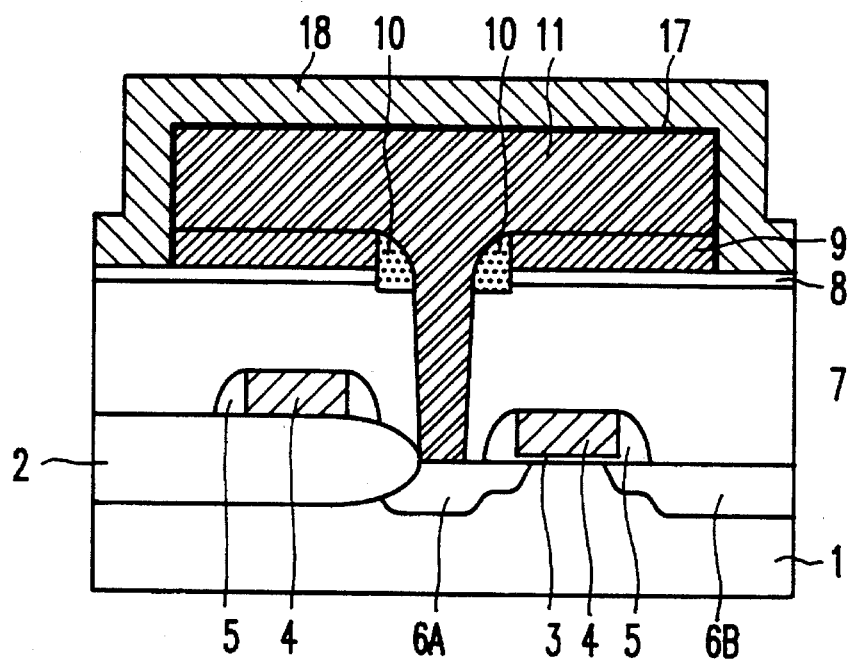
FIG. 1 is a sectional view of a capacitor manufactured by a prior art technology.
Figure 2A:
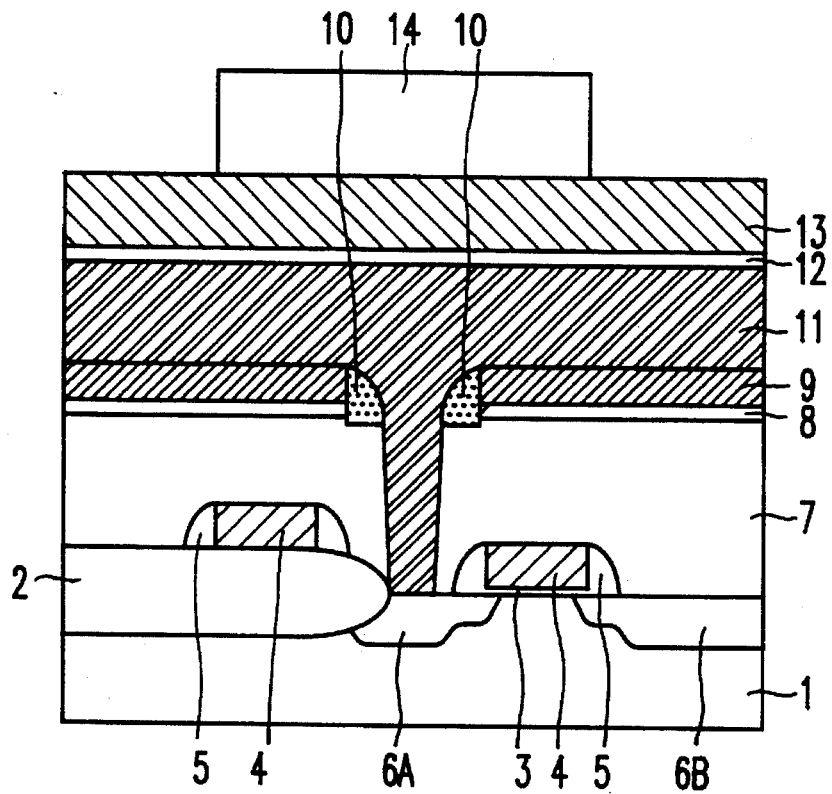
FIGS. 2A through 2D are sectional views illustrating the process of manufacturing the capacitor according to the first embodiment of the present invention.

Referring to FIG. 2A, an active region and a field region are defined by forming a field oxide film 2 on a silicon substrate 1. A gate oxide film 3 and a gate electrode 4 are formed in predetermined portions of the active region and the field region, and an insulation spacer 5 is formed on the side of the gate electrode 4. A source electrode 6A and a drain electrode 6B are formed on the portions of the silicon substrate 1 exposed to both sides of the gate electrode 4 by an impurity ion implantation process. An interlayer insulation film 7 is thickly formed on the entire structure including the MOSFET. A silicon nitride film 8 and a first polysilicon layer 9 are sequentially deposited on the interlayer insulation film 7. The exposed portions of the first polysilicon layer 9 and the silicon nitride film 8 are sequentially etched by an anisotropic etching process utilizing a contact hole mask. The anisotropic etching process is performed so that the interlayer insulation film 7 which is a lower layer is sufficiently exposed. A polysilicon is deposited on the surface of the first polysilicon layer 9 including a recess which is formed by etching the first polysilicon layer 9 and the silicon nitride film 8. The polysilicon is etched by an anisotropic etching process so that a part of the interlayer insulation film 7 constituting the bottom of the recess is exposed, thereby polysilicon spacers 10 are formed on the inner wall of the recess. A contact hole is formed by etching the exposed interlayer insulation film 7 by an anisotropic etching process utilizing the first polysilicon layer 9 and the polysilicon spacer 10 as an etching mask until a part of the source electrode 6A is exposed. The width of the contact hole can be smaller than when using the contact hole mask because the contact hole is formed by a self-alignment etching process, so that the high integration of the semiconductor integrated circuit is facilitated. A second polysilicon layer 11 is deposited on the first polysilicon layer 9 and the polysilicon spacer 10 including the contact hole. A first oxide film 12 and a third polysilicon layer 13 are sequentially deposited on the second polysilicon film 11. After coating a photoresist on the third polysilicon, a photoresist pattern 14 is formed by a photoresist patterning process utilizing the charge storage electrode mask.

The first polysilicon layer 9 and the polysilicon spacer 10 may be formed with doped polysilicon; however, it is preferable to form them with undoped polysilicon to increase the difference in the etching selection ratio from the interlayer insulation film 7 composed of an oxide such as BPSG (Boron Phosphorous Silicate Glass), etc.

In the case where the first polysilicon layer 9 and the polysilicon spacer 10 are formed with undoped polysilicon, the second polysilicon layer 11 is formed with the doped polysilicon implanted with a large quantity of impurities.

Thereafter, the first polysilicon layer 9 and the polysilicon spacer 10 are implanted with impurities by diffusing the impurities contained in the second polysilicon layer 11 by a thermal treatment process (e.g., a thermal treatment process performed for forming a dielectric film)onto said first polysilicon layer 9 and said polysilicon spacer 10.

On the other hand, in the case where the first polysilicon layer 9, the polysilicon spacer 10 and the second polysilicon layer 11 are formed with undoped polysilicon, the impurity implantation process is separately performed to implant them with impurities.

The width of the contact hole can be smaller than when using the contact hole mask because the contact hole is formed by a self-alignment etching process utilizing the first polysilicon layer 9 and the polysilicon spacer 10 as an etching mask.

Figure 2B:
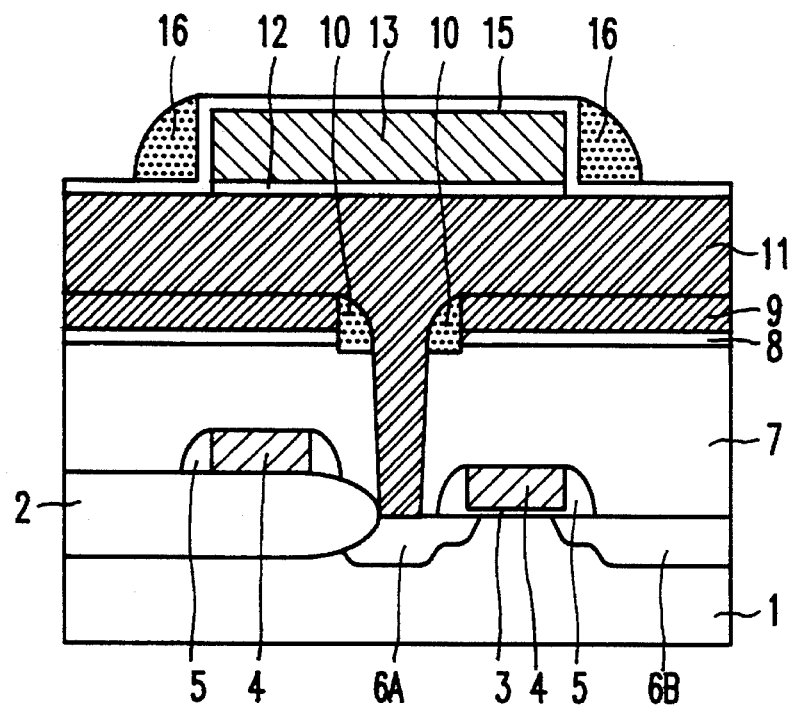

Referring to FIG. 2B, a pattern composed of the third polysilicon layer 13 and the first oxide film 12 is formed by sequentially etching the exposed part of the third polysilicon layer 13 and the fist oxide film 12 through an anisotropic etching process utilizing the photoresist pattern 14 as an etching mask. Thereafter, the photoresist pattern 14 is removed. A second oxide film 15 is deposited on the second polysilicon layer 11 including a pattern composed of the third polysilicon layer 13 and the first oxide film 12. A polysilicon is thickly deposited on the second oxide film 15 and, thereafter, a polysilicon spacer 16 is formed on the inner wall of the pattern composed of the third polysilicon layer 13 and the first oxide film 12 by etching the polysilicon by an etch-back process.

Figure 2C:
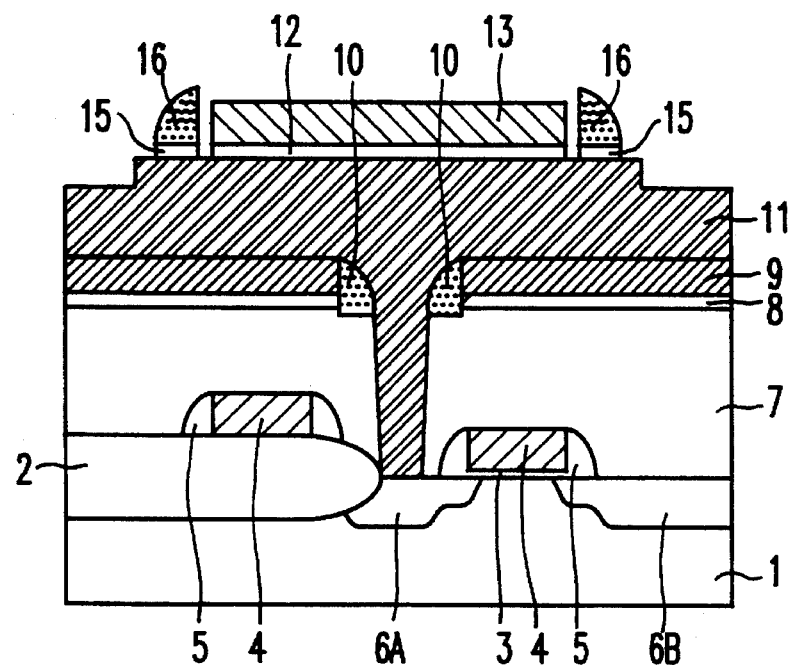

Referring to FIG. 2C, the second oxide film 15 is etched by an anisotropic etching process until the surfaces of the second and third polysilicon layers 11 and 13 are exposed. Therefore, the second oxide film 15 remains on the side wall of the pattern composed of the third polysilicon layer 13 and the first oxide film 12 and below the polysilicon spacer 16. The surface of the second polysilicon 11 is stepped by an anisotropic polysilicon etching process. The anisotropic polysilicon etching process makes the surface of the second polysilicon layer 11 steps because the process is performed until only a part of the third polysilicon layer 13 and the polysilicon spacer 16 remains. The exposed part of the second oxide film 15 is etched by an anisotropic oxide etching process utilizing the remaining third polysilicon layer 13 and the remaining polysilicon spacer 16 as an etching barrier layer.

Figure 2D:
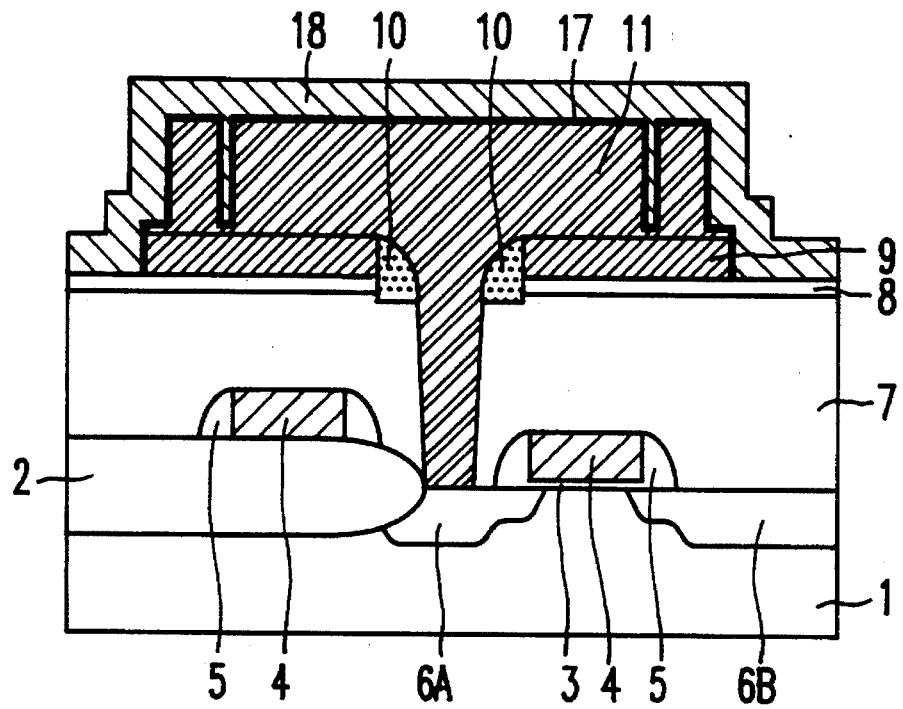

Referring to FIG. 2D, the charge storage electrode is formed by etching the first and second polysilicon layers 9 and 11 by an anisotropic polysilicon etching process utilizing the first and second oxide films 12 and 15 remaining on the second polysilicon layer 11 as an etching barrier layer and, thereafter, by removing the first and second oxide films 12 and 15. A trench is formed by etching the second polysilicon layer 11 exposed between the first oxide film 12 and the second oxide film 15 during the anisotropic polysilicon etching process, and the remaining third polysilicon layer 13 and the remaining polysilicon spacer 16 are removed. The side surface of the electric charge storing electrode becomes stepped due to the process of FIG. 2C which makes the surface of the second polysilicon layer 11 stepped. Therefore, in the structure of the charge storage electrode, trenches having a constant width and depth with a constant interval toward the center of the charge storage electrode along the side end of the charge storage electrode are formed, and the bottom of the side of the charge storage electrode is shaped as a single step.

The first and second oxide films 12 and 15 can be removed by either the anisotropic etching process or the isotropic etching process.

On the other hand, in the case where the silicon nitride film 8 is not deposited on the interlayer insulation film 7, and an undercut can be formed below the charge storage electrode by an isotropic etching process such that a part of the interlayer insulation film 7 is etching in the process of removing the first and second oxide films 12 and 15. At this time, the interlayer insulation film 7 should be formed with an oxide implanted with impurities such that the etching can be satisfactorily performed during the isotropic etching process for remove the first and second oxide films 12 and 15.

A dielectric film 7 is formed on the surface of the charge storage electrode. A plate electrode is formed by depositing and patterning a fourth polysilicon layer 18 on the dielectric film 17.

FIGS. 3A through 3E are sectional views to illustrating the process of manufacturing the capacity according to the second embodiment of the present invention.

Figure 3A:
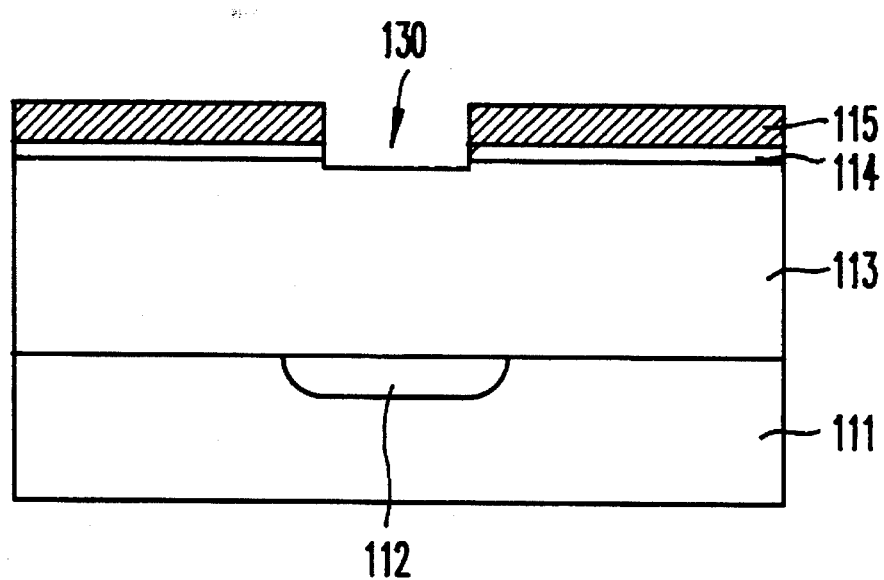
FIGS. 3A through BE are sectional views illustrating the process of manufacturing the capacitor according to the second embodiment of the present invention.

Referring to FIG. 3A, an interlayer insulation film 113 is thickly formed on a silicon substrate 111 formed with a junction region 112. A silicon nitride film 114 and a first polysilicon layer 115 are sequentially deposited on the interlayer insulation film 113. Exposed portions of the first polysilicon layer 115 and silicon nitride film 114 are sequentially etched by an etching process utilizing a contact hole mask, such that a recess 130 is formed. The anisotropic etching process is performed so that the interlayer insulation film 113 which is a lower layer is sufficiently exposed.

Figure 3B:
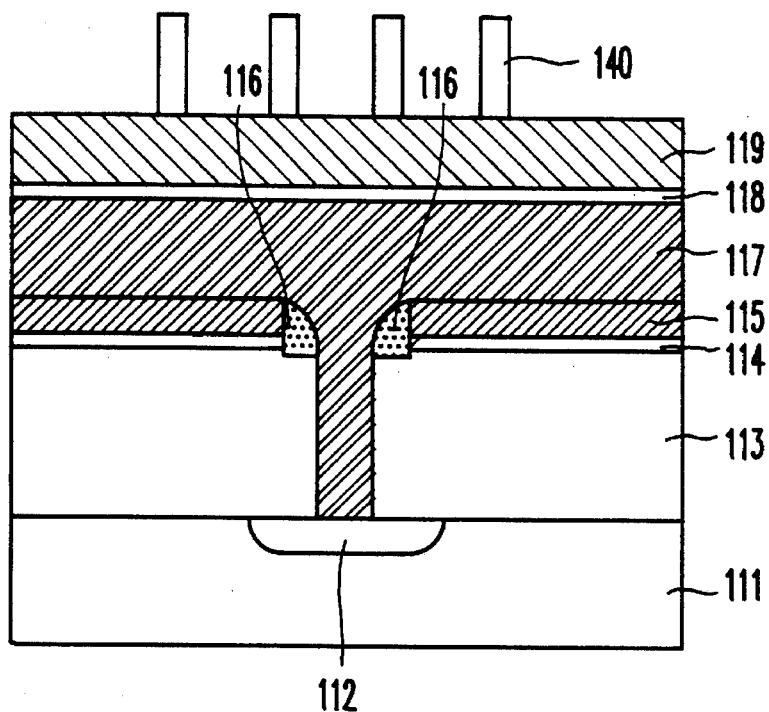

Referring to FIG. 3B, a polysilicon is formed on the surface of the first polysilicon layer 115 including the recess 130 formed by etching the first polysilicon layer 115 and the silicon nitride film 114, and thereafter a polysilicon spacer 116 is formed on the inner wall of the recess 130 by etching the polysilicon by an anisotropic etching process such that a part of the interlayer insulation film 113 constituting the bottom surface of the recess 130 is exposed. A contact hole is formed by etching the exposed interlayer insulation film 113 by an etching process utilizing the first polysilicon layer 115 and the polysilicon spacer 116 as an etching mask until a part of the junction region 112 is exposed. A second polysilicon layer 117 is deposited on the first polysilicon film 115 and the polysilicon spacer 116 including the contact hole. A first oxide film 118 and a third polysilicon layer 119 are sequentially deposited on the second polysilicon layer 117. A plurality of photoresist patterns 140 are formed on the third polysilicon layer 119 by a photoresist patterning process utilizing a charge storage electrode mask.

The first polysilicon layer 115 and the polysilicon spacer 116 may be formed with doped polysilicon, however, it is preferable to form them with undoped polysilicon to increase the difference in the etching selection ratio from the interlayer insulation film 113 composed of an oxide such as BPSG, etc.

In the case where the first polysilicon layer 115 and the polysilicon spacers 116 are formed with undoped polysilicon, the second polysilicon layer 117 is formed with doped polysilicon implanted with a large quantity of impurities. Thereafter, the first polysilicon layer 115 and the polysilicon spacer 116 are implanted with impurities by diffusing the impurities contained in the second polysilicon layer 117 by a thermal treatment process(e.g., a thermal treatment process performed to form a dielectric film) toward said first polysilicon layer 115 and said polysilicon spacer 116.

On the other hand, in the case where the first polysilicon layer 115, the polysilicon spacer 116 and the second polysilicon layer 117 are formed with undoped polysilicon, the impurity implantation process is separately performed to implant them with impurities.

The width of the contact hole can be smaller than when using the contact hole mask because the contact hole is formed by a self-alignment etching process utilizing the first polysilicon layer 115 and the polysilicon spacer 116 as an etching mask.

Figure 3C:
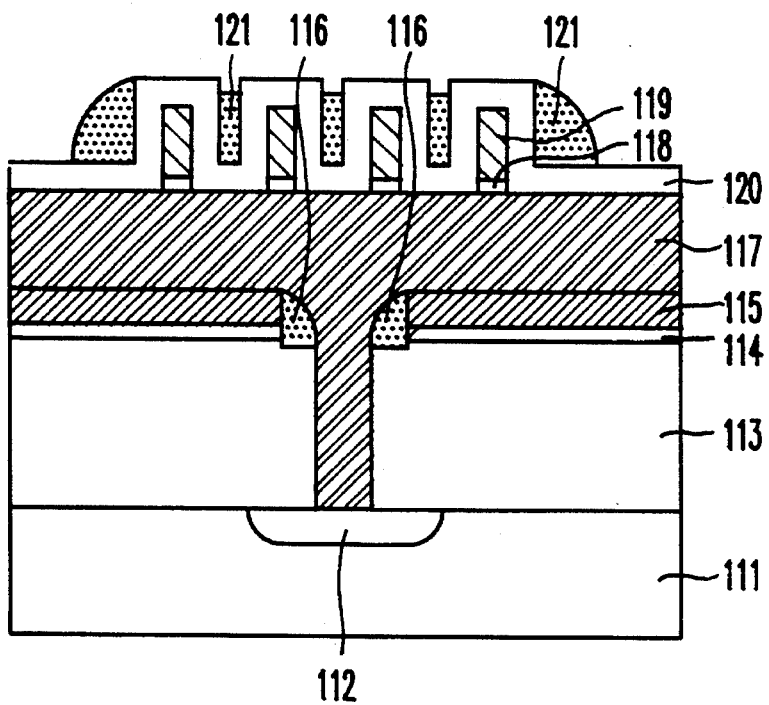

Referring to FIG. 3C, a plurality of patterns composed of the third polysilicon layer 119 and the first oxide film 118 is formed by sequentially etching the exposed part of the third polysilicon layer 119 and the first oxide film 118 by the anisotropic etching process utilizing the plurality of photoresist patterns 140 as an etching mask. Thereafter, the plurality of photoresist patterns 140 are removed. A second oxide film 120 is deposited on the second polysilicon layer 117 including a plurality of patterns composed of the third polysilicon layer 119 and the first oxide film 118. A polysilicon 121 is thickly deposited on the second oxide film 120 and, thereafter, the polysilicon 121 is remained in the form of a spacer on the outer wall of the outer most pattern among the plurality of patterns composed of the third polysilicon layer 119 and the first oxide film 118 and is remained in the buried between the patterns by an etch-back process.

Figure 3D:
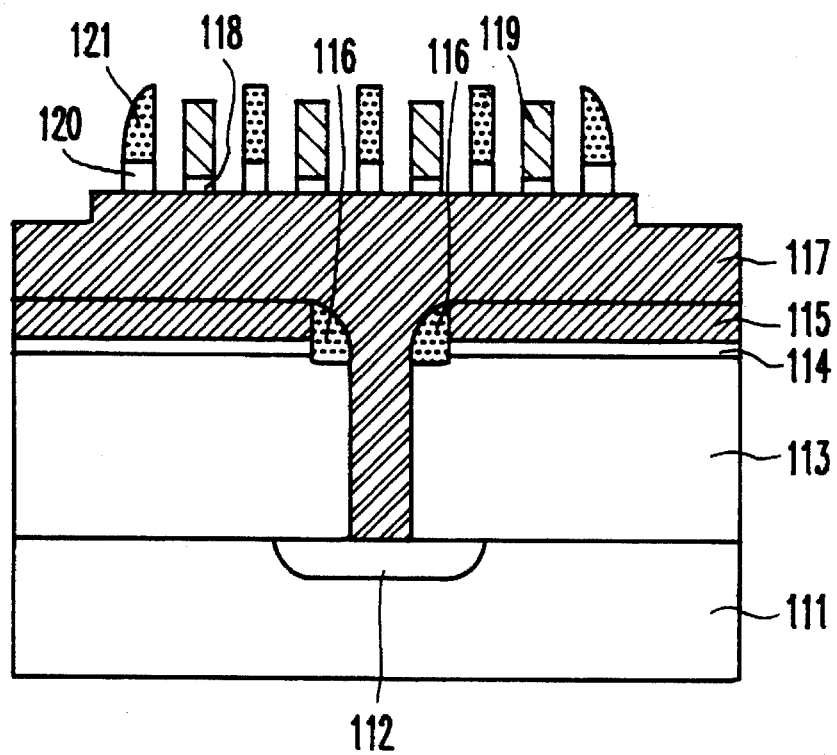

Referring to FIG. 3D, the second oxide film 120 is etched by an anisotropic etching process utilizing the remaining polysilicon 121 as an etching mask until the surfaces of the second and third polysilicon layers 117 and 119 are exposed. The surface of the second polysilicon 117 is stepped by an anisotropic polysilicon etching process. The anisotropic polysilicon etching process which makes the surface of the second polysilicon layer 117 stepped is performed until only a part of the third polysilicon layer 119 and the remaining polysilicon 121 remains. The exposed part of the second oxide film 120 is etched by an anisotropic etching process utilizing the remaining third polysilicon layer 119 and the remaining polysilicon 121 as an etching barrier layer.

Figure 3E:
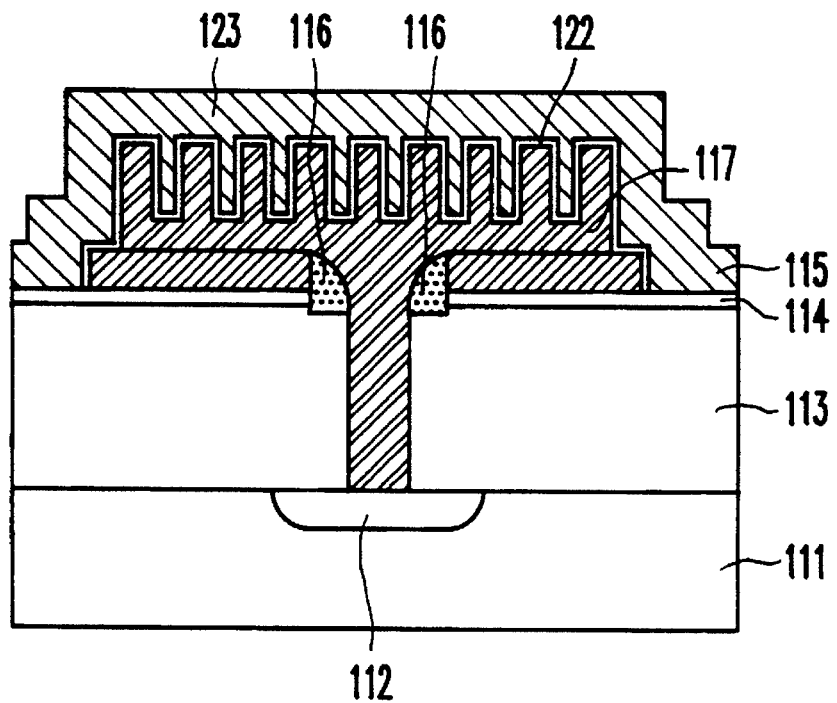

Referring to FIG. 3E, the electric charge storing electrode is formed by etching the exposed part of the first and second polysilicon layers 115 and 117 by an anisotropic polysilicon etching process utilizing the first and second oxide films 118 and 120 remaining on the second polysilicon layer 117 to act as an etching barrier layer. A plurality of trenches are formed by etching the second polysilicon layer 117 exposed between the first oxide film 118 and the second oxide film 120 during the anisotropic polysilicon etching process, and the remaining third polysilicon layer 119 on the first oxide film 118 and the remaining polysilicon 121 on the second oxide film 120 are naturally removed. The side surface of the charge storage electrode becomes stepped due to the process of FIG. 3D which makes the surface of the second polysilicon layer 117 stepped. Therefore, in the structure of the charge storage electrode, trenches having a constant width and depth with a constant interval toward the center of the charge storage electrode along the side end of the charge storage electrode are formed, at least one other trench is formed on top of the charge storage electrode surrounded by the trench. And the bottom of the side of the charge storage electrode is shaped as a single step.

The first and second oxide films 118 and 120 can be removed by either the anisotropic etching process or the isotropic etching process.

On the other hand, in the case where the silicon nitride film 114 is not deposited on the interlayer insulation film 113, and an undercut can be formed below the electric charge storing electrode by an isotropic etching process such that a part of the interlayer insulation film 113 is etched in the process of removing the first and second oxide film 118 and 120. At this time, the interlayer insulation film 113 should be formed with an oxide implanted with impurities such that the etching can be satisfactorily performed during the isotropic etching process to remove the first and second oxide films 118 and 120.

A dielectric film 122 is formed on the surface of the charge storage electrode. A plate electrode is formed by depositing and patterning a fourth polysilicon layer 123 on the dielectric film 122.

As described above, the present invention can obtain the effect of increasing the efficient surface area of the charge storage electrode by forming at least one trench on the surface of the charge storage electrode, and the resulting increase of capacitance improves the reliability of the device.

Although this invention has been described in its preferred form with a certain degree of particularity, it is appreciated by those skilled in the art that the present disclosure of the preferred form has been made only as an example and that numerous changes in the detailed of the construction, combination and arrangement of its parts may be resorted to without departing from the spirit and scope of the invention.

What is claimed is:

1. A method of manufacturing a semiconductor device comprising the steps of:

forming an interlayer insulation film on a silicon substrate formed with a junction region, and sequentially depositing a silicon nitride film and a first polysilicon layer on said interlayer insulation film;

sequentially etching exposed portions of said first polysilicon layer and said silicon nitride film by an etching process utilizing a contact hole mask, whereby a recess is formed;

depositing a polysilicon on the surface of said first polysilicon layer including said recess, and theen etching said polysilicon to form a polysilicon spacer on the inner wall of said recess;

etching said interlayer insulation film by an etching process utilizing said first polysilicon layer and said polysilicon spacer as an etching mask until a part of said junction region is exposed, whereby a contact hole is formed;

depositing a second polysilicon layer on said first polysilicon film and said polysilicon spacer including said contact hole;

sequentially depositing a first oxide film and a third polysilicon layer on said second polysilicon layer;

coating a photoresist on said third polysilicon layer, and then forming a photoresist pattern by a photoresist patterning process utilizing a charge storage electrode mask;

sequentially etching the exposed part of said third polysilicon layer and said first oxide film by an etching process utilizing said photoresist pattern as an etching mask, whereby the pattern composed of said third polysilicon layer and said first oxide film is formed;

removing said photoresist pattern, and then depositing a second oxide film on said second polysilicon layer including said pattern;

depositing a polysilicon on said second oxide film, and then etching said polysilicon to form a polysilicon spacer on the inner wall of said pattern;

etching the exposed part of said second oxide film until a part of the surface of said second and third polysilicon layers is exposed;

etching the exposed part of said second polysilicon layer by an anisotropic polysilicon etching process, whereby the surface of said second polysilicon layer is stepped;

etching the exposed part of said second oxide film by the anisotropic oxide etching process to expose said second polysilicon layer between said pattern and said polysilicon spacer; and etching said second polysilicon layer by the anisotropic polysilicon etching process utilizing said first and second oxide films remaining on said second polysilicon layer as an etching barrier layer until said silicon nitride film is exposed and, then removing said remaining first and second oxide films to form a charge storage electrode;

forming a dielectric film on the surface of said charge storage electrode, and then forming a plate electrode on said dielectric.

2. The method of manufacturing a semiconductor device of claim 1, wherein said interlayer insulation film is formed with an oxide.

3. The method of manufacturing a semiconductor device of claim 1, wherein said first polysilicon layer and said polysilicon spacer formed on the inner wall of said recess are formed with undoped polysilicon to increase the difference in the etching selection ratio from said interlayer insulation film.

4. The method of manufacturing a semiconductor device of claim 1, wherein, in the case where said first polysilicon layer and said polysilicon spacer formed on the inner wall of said recess are formed with said undoped polysilicon, said second polysilicon layer is formed with a doped polysilicon implanted with a large quantity of impurities and then said first polysilicon layer and said polysilicon spacer are implanted with the impurities by diffusing the impurities contained in said second polysilicon layer by a thermal treatment process Onto said first polysilicon layer and said polysilicon spacer.

5. The method of manufacturing a semiconductor device of claim 1, wherein said anisotropic polysilicon etching process to make the surface of said second polysilicon layer stepped is performed until only a part of said third polysilicon layer and said polysilicon spacer formed on the inner wall of said pattern remains.

6. The method of manufacturing a semiconductor device of claim 1, wherein, said second polysilicon layer exposed between said first oxide film is etched during the anisotropic polysilicon etching process utilizing said first and second oxide films remaining on said second polysilicon layer as an etching barrier layer, and said second oxide film is etched to form a trench, and said third polysilicon layer and a polysilicon spacer formed on the inner wall of said pattern are removed.

7. The method of manufacturing a semiconductor device of claim 1, wherein said trench has a constant width and depth with a constant interval toward the center of said electric charge storing electrode along the side end of said electric charge storing electrode.

8. The method of manufacturing a semiconductor device of claim 1, wherein said first and second oxide films are removed by the anisotropic etching process.

9. The method of manufacturing a semiconductor device of claim 1, wherein said first and second oxide films are removed by the isotropic etching process.

10. The method of manufacturing a semiconductor device of claim 1, wherein, in the case where said silicon nitride film is not deposited on said interlayer insulation film, an undercut is formed below said electric charge storing electrode by an isotropic etching process such that a part of said interlayer insulation film is etched during the process to remove said first and second oxide films.

11. The method of manufacturing a semiconductor device of claim 1, wherein said interlayer insulation film is formed with an oxide implanted with impurities such that the etching can be satisfactorily performed during the isotropic etching process to remove said first and second oxide films.

12. A method of manufacturing a semiconductor device, comprising the steps of:

forming an interlayer insulation film on a silicon substrate formed with a junction region, and sequentially depositing a silicon nitride film and a first polysilicon layer on said interlayer insulation film;

sequentially etching exposed portions of said first polysilicon layer and said silicon nitride film by an etching process utilizing a contact hole mask, whereby a recess is formed;

depositing a polysilicon on the surface of said first polysilicon layer including said recess, and etching said polysilicon to form a polysilicon spacer on the inner wall of said recess;

etching the interlayer insulation film by an etching process utilizing said first polysilicon layer and said polysilicon spacer as an etching mask until a part of said junction region is exposed, whereby a contact hole is formed;

depositing a second polysilicon layer on said first polysilicon film and said polysilicon spacer including said contact hole;

sequentially depositing a first oxide film and a third polysilicon layer on said second polysilicon layer;

coating a photoresist on said third polysilicon layer, and then forming a plurality of photoresist patterns by a photoresist patterning process utilizing a charge storage electrode mask;

sequentially etching the exposed part of said third polysilicon layer and said first oxide film by an etching process utilizing said plurality of photoresist patterns as an etching mask, whereby a plurality of patterns composed of said third polysilicon layer and said first oxide film are formed;

removing said plurality of photoresist patterns, and depositing a second oxide film on said second polysilicon layer including said plurality of patterns;

depositing a polysilicon on said second oxide film, and then etching said polysilicon to remain in the form of a spacer on the outer wall of, the outer most pattern among the plurality of patterns and kept buried between the patterns;

etching the exposed part of said second film by an etching process utilizing the remaining polysilicon as an etching mask until a part of the surface of said second and third polysilicon layer is exposed;

etching the exposed part of said second polysilicon layer by an anisotropic polysilicon etching process, whereby the surface of said second polysilicon layer is stepped;

etching the exposed part of said second oxide film by an anisotropic oxide etching process to expose said second polysilicon layer between said plurality of patterns and said remained polysilicon;

etching said second polysilicon layer by the anisotropic polysilicon etching process utilizing said first and second oxide films remaining on said second polysilicon layer as an etching barrier layer until said silicon nitride film is exposed, and removing said remaining first and second oxide films to form a charge storage electrode; and forming a dielectric film on the surface of said charge storage electrode, and forming a plate electrode on said dielectric.

13. The method of manufacturing a semiconductor device of claim 12, wherein said interlayer insulation film is formed with an oxide.

14. The method of manufacturing a semiconductor device of claim 12, wherein said first polysilicon layer and said polysilicon spacer formed on the inner wall of said recess are formed with undoped polysilicon to increase the difference in the etching selection ratio from said interlayer insulation film.

15. The method of manufacturing a semiconductor device of claim 12, wherein, in the case where said first polysilicon layer and said polysilicon spacer formed on the inner wall of said recess are formed of said undoped polysilicon, said second polysilicon layer is formed on a doped polysilicon implanted with a large quantity of impurities, and thereafter said first polysilicon layer and said polysilicon spacer are implanted with impurities by diffusing the impurities contained in said second polysilicon layer by a thermal treatment process onto said first polysilicon layer and said polysilicon spacer.

16. The method of manufacturing a semiconductor device of claim 12, wherein said anisotropic polysilicon etching process to make the surface of said second polysilicon layer stepped is performed until only a part of said third polysilicon layer composing the plurality of patterns and said remained polysilicon remains.

17. The method of manufacturing a semiconductor device of claim 12, wherein, during the anisotropic polysilicon etching process utilizing said first and second oxide films remaining on said second polysilicon layer as an etching barrier layer, said second polysilicon layer exposed between said first oxide film and said second oxide film is etched to form a plurality of trenches, and said third polysilicon layer and the remaining polysilicon are removed.

18. The method of manufacturing a semiconductor device of claim 17, wherein, among the plurality of trenches, a trench having a constant width and depth with a constant interval toward the center of said charge storage electrode along the side end of said charge storage electrode is formed on top of the charge storage electrode, and at least one other trench is formed on top of the charge storage electrode surrounded by the trench.

19. The method of manufacturing a semiconductor device of claim 12, wherein said first and second oxide films are removed by the anisotropic etching process.

20. The method of manufacturing a semiconductor device of claim 12, wherein said first and second oxide films are removed by the isotropic etching process.

21. The method of manufacturing a semiconductor device of claim 12, wherein, in the case where said silicon nitride film is not deposited on said interlayer insulation film, an undercut is formed below said charge storage electrode by an isotropic etching process such that a part of said interlayer insulation film is etched during the process to said first and second oxide films.

22. The method of manufacturing a semiconductor device of claim 21, wherein said interlayer insulation film is formed with an oxide implanted with impurities such that the etching can be satisfactorily performed during the isotropic etching process to remove said first and second oxide films.

* * * * *